United States Patent
van der Avoort et al.

(10) Patent No.: US 9,318,997 B2
(45) Date of Patent: Apr. 19, 2016

(54) RESONATOR

(71) Applicant: NXP B.V., Eindhoven (NL)

(72) Inventors: Casper van der Avoort, Waalre (NL); Andreas Bernardus Maria Jansman, Nuenen (NL); Robert James Pascoe Lander, Leuven (BE)

(73) Assignee: NXP, B.V., Eindhoven (NL)

( * ) Notice: Subject to any disclaimer, the term of this patent is extended or adjusted under 35 U.S.C. 154(b) by 0 days.

(21) Appl. No.: 14/034,398

(22) Filed: Sep. 23, 2013

(65) Prior Publication Data
US 2014/0176246 A1 Jun. 26, 2014

(30) Foreign Application Priority Data
Sep. 27, 2012 (EP) .................... 12186407

(51) Int. Cl.
*H03B 5/30* (2006.01)
*H03B 1/00* (2006.01)
*H03H 9/00* (2006.01)
*H03H 9/02* (2006.01)
*H03H 9/24* (2006.01)

(52) U.S. Cl.
CPC .. *H03B 1/00* (2013.01); *H03B 5/30* (2013.01); *H03H 9/00* (2013.01); *H03H 9/02338* (2013.01); *H03H 9/02433* (2013.01); *H03H 9/2452* (2013.01); *H03B 2202/00* (2013.01); *H03H 2009/02307* (2013.01); *H03H 2009/02456* (2013.01); *H03H 2009/02496* (2013.01)

(58) Field of Classification Search
CPC ......... H03B 5/30; H03B 2202/00; H03H 9/00

USPC ....... 331/154, 116 M, 96; 29/25.35; 333/186, 333/189
See application file for complete search history.

(56) References Cited

U.S. PATENT DOCUMENTS

| 7,956,517 B1 | 6/2011 | Motiee et al. |
|---|---|---|
| 8,294,534 B2 | 10/2012 | van der Avoort et al. |
| 8,669,822 B2 * | 3/2014 | Lander .......................... 331/154 |
| 2010/0314969 A1 | 12/2010 | Gaidarzhy et al. |
| 2012/0092082 A1 | 4/2012 | Hentz et al. |
| 2012/0187507 A1 | 7/2012 | Bontemps et al. |
| 2012/0249265 A1 | 10/2012 | van der Avoort et al. |
| 2012/0262242 A1 * | 10/2012 | van der Avoort .. H03H 9/02338 331/154 |

FOREIGN PATENT DOCUMENTS

| EP | 2 479 891 | * | 7/2012 |
| EP | 2 479 891 A1 | | 7/2012 |
| WO | 2004/053431 A2 | | 6/2004 |

OTHER PUBLICATIONS

Rabinovich, V. L. et al. "The Effect of Release-Etch Holes on the Electromechanical Behavior of MEMS Structures", IEEE 1997 International Conference on Solid State Sensors and Actuators, vol. 2, p. 1125-1128 (Jun. 1997).

(Continued)

*Primary Examiner* — Arnold Kinkead

(57) ABSTRACT

A resonator has a main resonator body and a secondary resonator structure. The resonator body has a desired mode of vibration of the resonator alone, and a parasitic mode of vibration, wherein the parasitic mode comprises vibration of the resonator body and the secondary resonator structure as a composite body. In this way, unwanted vibrational modes are quenched by the second suspended body.

15 Claims, 9 Drawing Sheets

(56) References Cited

OTHER PUBLICATIONS

Kaajakari, V. et al. "Nonlinear Limits for Single-Crystal Silicon Microresonators", Journal of Microelectromechanical Systems, vol. 13, No. 5, pp. 715-724 (2004).

Hsu, W.-H. "Vibrating RF MEMS for Timing and Frequency References", IEEE MTT-S International Microwave Symposium Digest, pp. 672-675 (2006).

Abdolvand, R. et al. "Enhanced Power Handling and Quality Factor in Thin-Film Piezoelectric-on-Substrate Resonators", IEEE Ultrasonics Symposium, pp. 608-611 (2007).

Yuan, X. et al. "1.52-GHz Micromechanical Extensional Wine-Glass Mode Ring Resonators", IEEE Transactions on Ultrasonics, Ferroelectrics and Frequency Control, vol. 55, No. 4, pp. 890-907 (Apr. 2008).

Van der Avoort, C. et al. "Amplitude Saturation of MEMS Resonators explained by Autoparametric Resonance", Journal of Micromechanical and Microengineering, 15 pgs (2010).

"RF MEMS", Sandia National Laboratories, 3 pgs, retrieved from the internet Sep. 20, 2013: http://www.mems.sandia.gov/about/rf-mems.html (2012).

Extended European Search Report for Patent Appln. No. 12186407.8 (Feb. 15, 2013).

\* cited by examiner

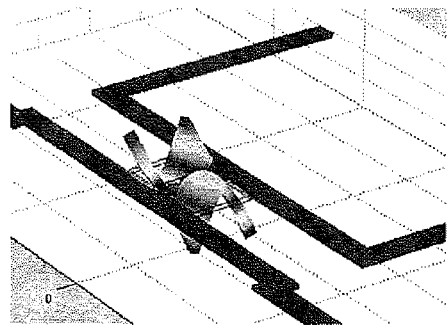 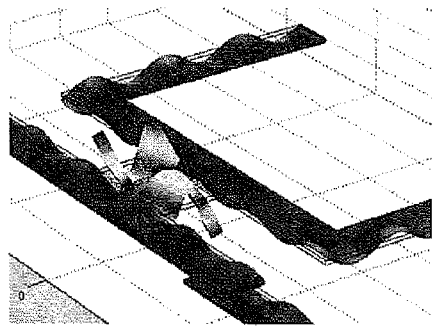
FIG. 16A  FIG. 16B
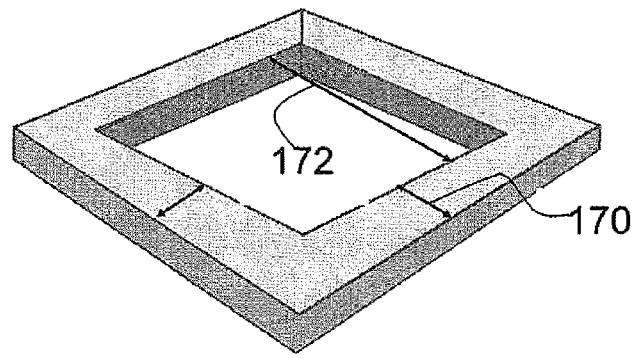
FIG. 17
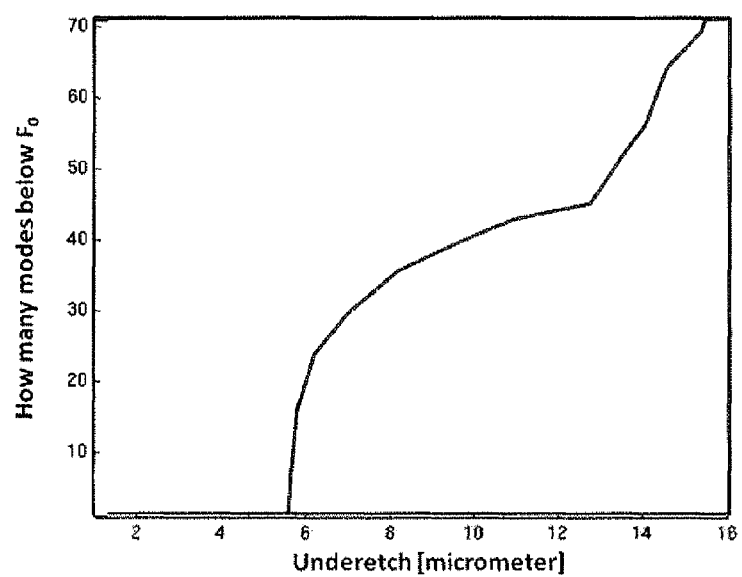
FIG. 18

RESONATOR

CROSS-REFERENCE TO RELATED APPLICATIONS

This application claims the priority under 35 U.S.C. §119 of European patent application no. 12186407.8, filed on Sep. 27, 2012, the contents of which are incorporated by reference herein.

This invention relates to resonators, for example MEMS resonators.

In various products MEMS resonators are replacing quartz resonators as reference timing devices; they serve as reference resonators in oscillator circuits or as clocking reference to synchronise operations in digital circuitry. MEMS resonators offer the advantage of small dimensions (especially the small height is considered an advantage) with low-cost fabrication. In another application, MEMS resonators can also be combined to form a high-quality filter.

In oscillator circuits, the most important demands on the MEMS resonator are:
  (i) a stable resonance frequency
  (ii) a high quality factor, to minimise the contribution of the MEMS resonator to the phase noise of the oscillator, and
  (iii) a non-distorted large amplitude output signal to give a high signal-to-noise ratio of the oscillator and for a linear oscillator output.

If employed in a filter, MEMS resonators should meet the same demands for different reasons:
  (i) a stable resonance frequency to have stable filter operation
  (ii) a high quality factor to give a low insertion loss, and
  (iii) non-distorted large amplitude output signal, to give a large dynamic range.

This invention aims to improve on the third of these requirements.

MEMS resonators exhibit a limit to the amplitude of the resonant oscillations which is below that which would be expected from the mechanical design. The origin of this limitation has only been fully understood very recently, and relates to the transfer of energy from the desired mode of vibration (eigenmode) to other eigenmodes.

According to the invention, there is provided a resonator as claimed in claim 1.

In one aspect, the invention provides a resonator comprising:
  a resonator body;
  an actuation arrangement for driving the resonator into a resonant mode, in which the resonator body vibrates parallel to a first axis;
  a detection arrangement for detecting the vibration in the first axis direction and generating an electrical output signal derived from the vibration; and
  a second resonator structure which is coupled to nodal points of the resonator body with respect to the main resonant mode of the resonator body.
  wherein the resonator body has a desired mode of vibration of the resonator alone, and a parasitic mode of vibration, wherein the parasitic mode comprises vibration of the resonator body and the second resonator structure as a composite body.

This arrangement is designed to suppress the quality factor of parasitic modes by coupling the anchor arrangement to the resonator for those modes. A second resonating body is provided which vibrates only in the parasitic modes of vibration. In this way, the autoparametric resonance which limits the vibration amplitude is shifted so that the stable vibration amplitude of the resonator is increased. Unwanted vibrational modes are effectively quenched by the second resonating body, which forms the suspension of the main resonator body.

The resonator preferably comprises an anchor arrangement which provides a connection between the resonator body and a fixed support.

In one arrangement, the second resonator structure comprises the anchor arrangement. In this case, the anchors (which are for example used to deliver and drain current to/from the resonator) also functions as a resonator body. This can be achieved by forming the anchor elements at least partly as suspended bodies.

For example, the anchor arrangement can comprise electrode areas having etch holes, and a cavity area formed beneath the etch holes. These etch holes then result in sacrificial etching of parts of the anchor arrangement, thereby forming components which can resonate together with the connected resonator body.

The anchor arrangement can comprise a pair of anchor elements mechanically coupled to the resonator body, and a sensing circuit which drives a current through the resonator body between the anchor elements, wherein the anchor elements and the resonator body together form a composite resonant structure with composite eigenmodes with mode shapes having vibration components in directions perpendicular to the first axis in the resonator body and the anchor elements.

In another arrangement, the second resonator structure can comprise a suspended body which is connected to the fixed support. In this case, a separate structure is formed, but it is connected to the same fixed support as the anchor elements. Again, it preferably comprises a suspended area, which can again be formed by sacrificial etching through a pattern of etch holes.

The anchor arrangement can again comprise a pair of anchor elements mechanically coupled to the resonator body, and a sensing circuit which drives a current through the resonator body between the anchor elements, wherein the second resonator structure and the resonator body together form a composite resonant structure with composite eigenmodes with mode shapes having vibration components in directions perpendicular to the first axis in the resonator body and the second resonator structure.

In both examples, the composite eigenmodes comprise the parasitic modes of vibration, which are perpendicular to the main resonator vibration mode. The quality factor of the composite eigenmodes of the resonator (in the perpendicular direction) is lower than the quality factor of the desired resonator eigenmode (in first the axis direction).

The second resonator structure can comprise a plurality of bodies which are mutually not coupled mechanically or else the second resonator structure can comprise a plurality of bodies which are mutually coupled mechanically.

In one example the second resonator structure can comprise a suspended closed shape around a fixed centre and formed from the same layer as the resonator body.

The resonator preferably comprises a MEMS resonator. In one specific design, the resonator body comprises a pair of arms which extend along the first axis direction, with a head at each end of the pair of arms, wherein the anchor arrangement comprises two anchor elements, which connect laterally to the midpoint of the two arms. The actuation electrodes can be at the ends of the heads positioned along a central axis in the first axis direction of the resonator.

BRIEF DESCRIPTION OF THE DRAWINGS

Examples of the invention will now be described with reference to the accompanying drawings, in which:

FIGS. 16A and 16B show graphically two different modes outlined above;

FIG. 17 shows an example of possible shape of the anchor arrangement;

FIG. 18 shows how the number of vibration modes of the shape of FIG. 17 varies with width of the shape.

DETAILED DESCRIPTION

MEMS resonators are designed such that an actuation signal excites one of the resonator's eigenmodes.

Figure 1:
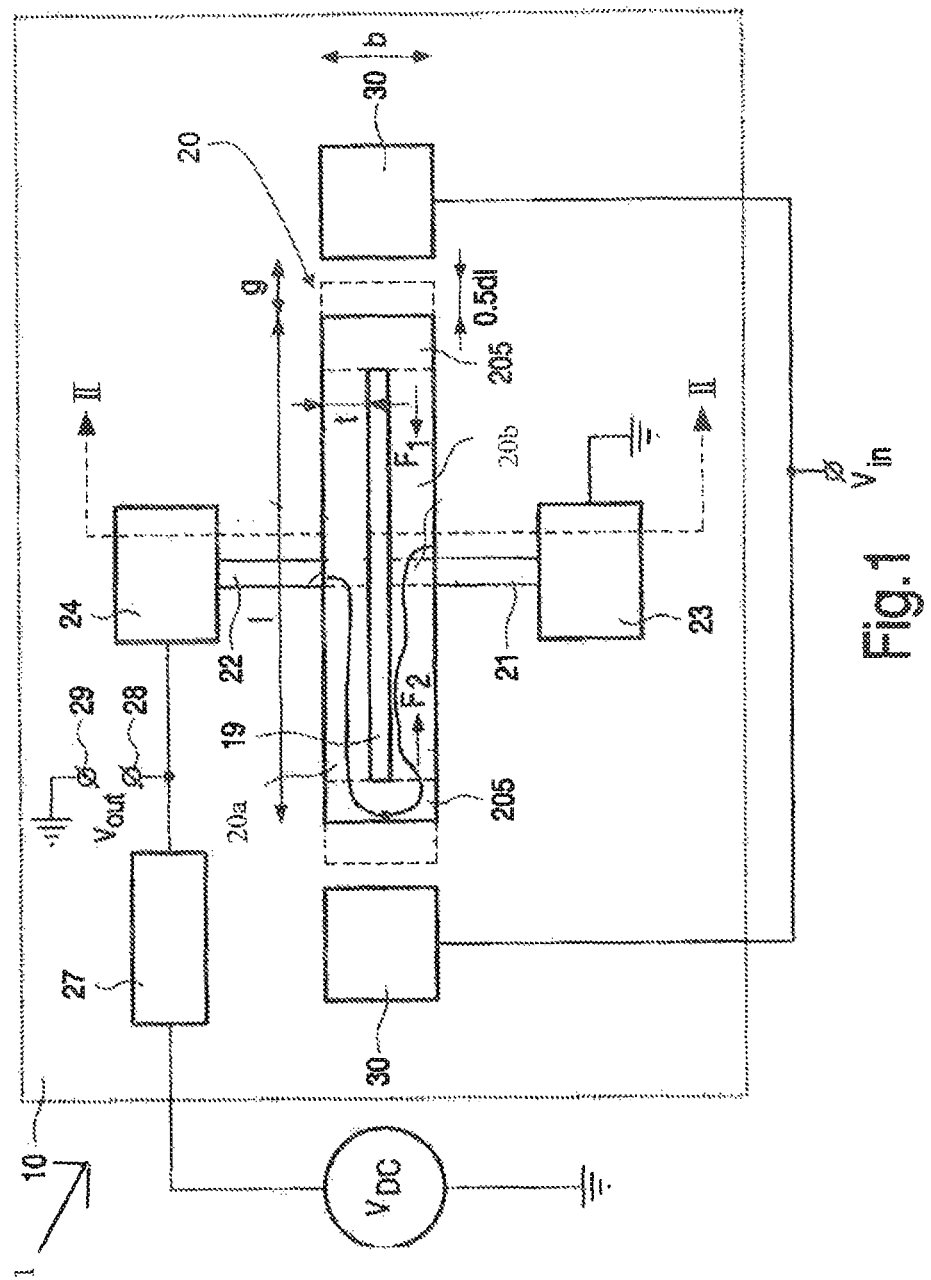
FIG. 1 shows a known resonator.

FIG. 1 shows a resonator designed to vibrate in a length-extensional mode when an ac actuation voltage is applied. If properly designed, the actuation signal does not excite other modes (like bending modes or torsion modes in this example).

The design shown in FIG. 1 is a known piezoresistive MEMS resonator, which is described in more detail in WO 2004/053431.

The resonator 1 shown in FIG. 1 comprises a substrate 10 which is a silicon wafer. Alternatively, the substrate 10 may be a gallium arsenide wafer or it may comprise any other semi-conducting, metal or dielectric material. For resonators 1 designed for operation at frequencies above 10 MHz it is advantageous to use a substrate 10 comprising a dielectric such as, e.g. glass, because this reduces the loss of electromagnetic energy dissipated in the substrate.

The resonator 1 further comprises an electrically conductive resonator element 20 having two parallel connecting elements 20a,20b. The resonator extends in a longitudinal direction having a length l along a first axis which is the axis along which the intended vibrations arise, for operation in bulk mode. It is attached to the substrate 10 via support elements 21 and 22 which are connected to anchor elements 23 and 24, respectively. The anchor elements 23 and 24 are affixed to the substrate 10. The resonator element 20 and the support elements 21 and 22 are free from the substrate 10 except for the connection via the anchor elements 23 and 24.

Figure 2:
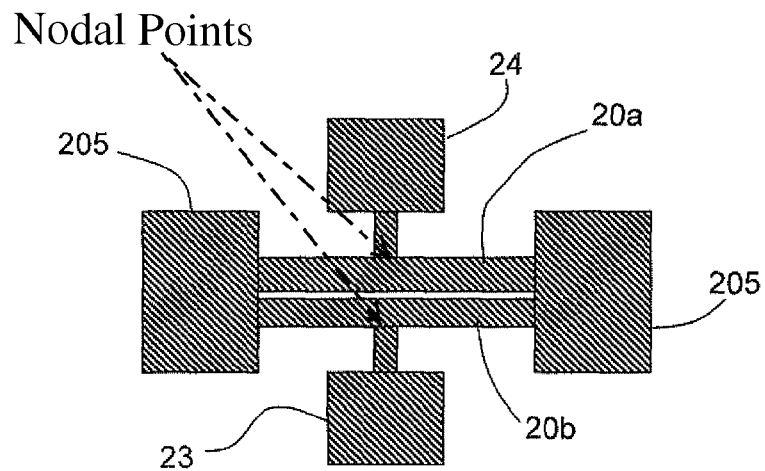
FIG. 2 shows a modification to the resonator design of FIG. 1.

The resonator element 20 has two outer ends 205 in the longitudinal direction. These can be larger than the combined width of the connecting beams 20a,20b and spacing 19 to define wider resonator masses at the ends, and thereby define a so-called dog-bone shape. This is shown in FIG. 2.

Referring back to FIG. 1, each of the outer ends 205 is faced by a respective electrode of the electrically conductive actuator 30, and is spaced from the electrode by an actuation gap g. The actuators can be considered to be gate terminals, in that the control input is applied to these terminals. The actuator 30 is able to receive an actuation potential difference $V_{IN}$ with respect to the resonator element 20 for elastically deforming the resonator element 20, using the electrostatic force. The actuation potential difference is a function of the input signal applied to the resonator 1. In addition to the input signal the actuation potential difference may typically further contain a DC component. The elastic deformation comprises a change of the length l by an amount dl shown in FIG. 1.

A feedback system controls the frequency of the actuation voltage, and the feedback loop stabilises at resonance with the actuation voltage frequency the same as the physical resonant frequency of the resonator.

The resonator element 20 is part of an oscillator circuit which is able to conduct an electrical current through the resonator element 20. The resonator element 20 is electrically connected to the positive or negative pole of a DC voltage source $V_{DC}$ via an auxiliary resistor 27, the anchor element 24 and the support element 22. The anchor 24 can be considered to be a drain terminal in that the DC voltage bias is applied to this terminal to drive a bias current through the device. The resonator element 20 is further connected to ground via the support element 21 and the anchor element 23. The anchor 23 can be considered to be a source terminal in that the bias current is collected at this terminal. Therefore, the resonator element 20 is able to conduct an electrical current I. It constitutes a resistor with an ohmic resistance R which causes a voltage drop V when the resonator element 20 conducts the electrical current I.

The resonator element 20 constitutes a resistor with an ohmic resistance R which is a function of the change dl of the length l because the resonator element 20 comprises a central part 19 with open space. The resonator element 20 comprises the two mutually parallel beams 20a,20b each of which is affixed to a respective support element 21 and 22. The two beams are connected with each other at the two outer ends by elements 205. The central part 19 has been created during a lithography step and etching step. It prevents the current from flowing from the support element 22 to the support element 21 in a straight line. The current has to follow the conductive path formed by the resonator element 20. This conductive path extends in the longitudinal direction.

The circuit is able to produce an output signal which is a function of the change dl of the length l and which is a function of the resistance R. To this end the circuit comprises a measurement point 28 which is electrically connected to the circuit. It is situated between the auxiliary resistor 27 and the anchor element 24, and in operation it produces an electrical output signal which is the electrical potential difference Vout between the measurement point 28 and the reference point 29 which is connected to ground.

In an alternative embodiment, not shown, the auxiliary resistor 27 is not situated between the voltage source and the anchor element 24, but instead between the anchor element 23 and ground. In this case the measurement point 28 is situated between the auxiliary resistor 27 and the anchor element 23.

In yet another embodiment, not shown either, the DC voltage source $V_{DC}$ and the auxiliary resistor 27 are omitted. The anchor element 24 is connected to the positive pole of a current source and the anchor element 23 is connected to the negative pole of the current source. The measurement point 28 is situated between the positive pole of the current source and the anchor element 24, and the reference point 29 is situated between the anchor element 23 and the negative pole of the current source. Thus, a voltage is measured for a constant current, or else a current portion is measured for a constant total voltage.

The output signal is again a function of the change dl of the length l as will be understood by those skilled in the art. Thus, sensing using current bias or voltage bias can be employed.

The resulting mechanical resonance is in-plane of the drawing and is symmetrical. As mentioned above, the left and right parts of the resonator can be enlarged to define masses of relatively larger stiffness than the intermediate beams, so the compression and expansion that cause the resonator-vibration occurs in the beams.

Since the mechanical vibration is symmetrical, the centre of the structure between the drain and source 24, 23 remains mechanically fixed as well.

The so called actuation-gap on each side is located between the gate electrodes 30 and the resonator mass and is in the order of a few hundred nm.

The resonator may be manufactured using a technique well known in the field of micro electromechanical systems (MEMS).

Figure 3:
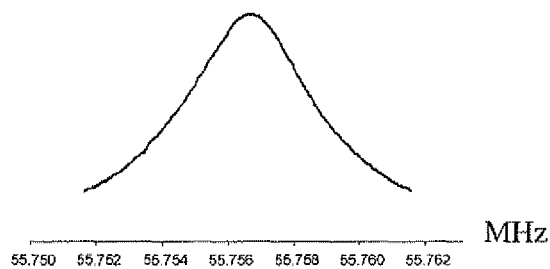
FIG. 3 shows the amplitude vs. frequency characteristics for the resonator of FIG. 2.

A plot of the vibration amplitude versus the actuation frequency is shown in FIG. 3. As shown, the resonator has a vibration amplitude which has a peak at a specific resonant frequency.

Figure 4:
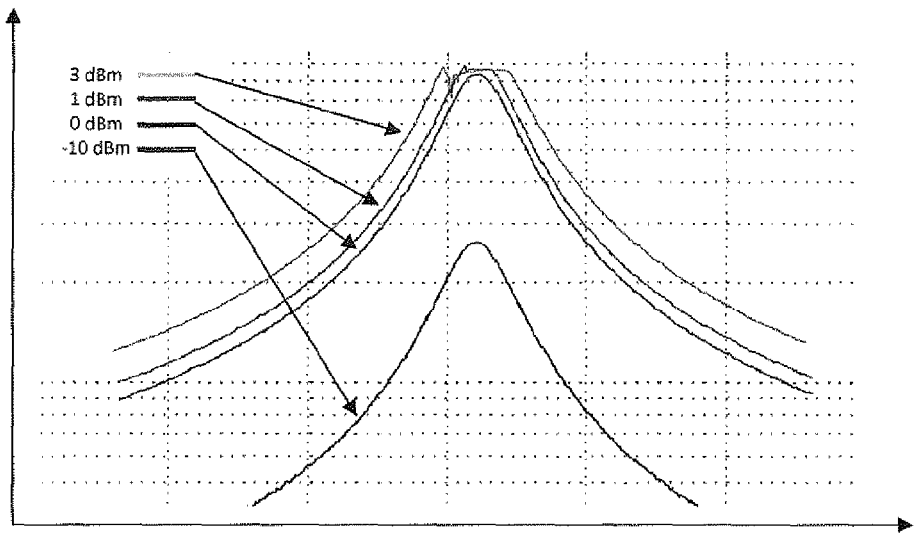
FIG. 4 shows how the amplitude vs. frequency characteristic can become clipped.

Ideally, the MEMS resonator is a purely linear device: if the actuation voltage doubles then the vibration amplitude doubles. Unfortunately, amplitude saturation is observed, meaning that the peak of the vibration amplitude peak is limited to a fixed level. This is shown in FIG. 4, which shows the amplitude plots of FIG. 3 (vibration amplitude vs. actuation frequency) for different actuation voltages. The actuation level is expressed in dBm, providing a measure of signal power.

For the larger actuation voltages, the capping can be seen.

This undesired saturation effect has been reported from groups all over the world and hinders successful use of MEMS resonators for oscillator and filter applications.

The origin of this amplitude saturation has only very recently been revealed. If its vibration amplitude is above a particular threshold, the length-extensional vibration excites another eigenmode (or a combination of eigenmodes), which will be referred to as a parasitic mode.

The parasitic mode drains energy from the desired length-extensional mode. An increase in actuation amplitude does not lead to an increased amplitude of the desired mode, but rather to an increase of amplitude of the parasitic mode. This effect is called autoparametric resonance and is discussed in C van der Avoort et al *"Amplitude saturation of MEMS resonators explained by autoparametric resonance"* 2010 J. Micromech. Microeng. 20 105012.

Figure 5:
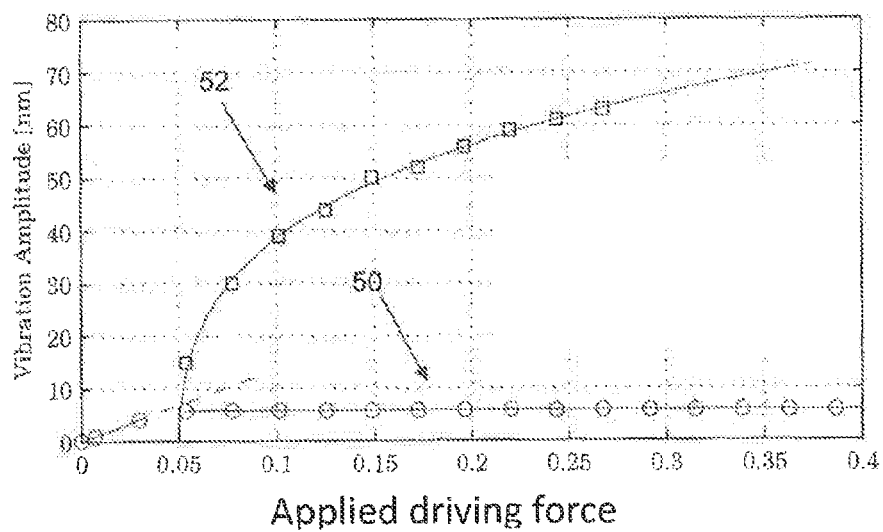
FIG. 5 shows how an applied driving force is coupled to main and parasitic modes of vibration.

This effect is shown in FIG. 5, which shows actual measurements of saturation. The electrical output generated by the longitudinal vibration (plot 50) is saturated at a certain point. Optical vibration measurements of the out-of-plane vibration are shown as plot 52. These occur at the eigenfrequency for the out-of-plane mode, which is different from the driven longitudinal mode. This shows an increasing amplitude of this mode as the driving level is further increased.

Thus, the regular electrical response of the resonator is limited, and beyond a certain driving force level the electrical output signal does not grow anymore.

When the principal mode is a length-extension mode, the parasitic modes involved are bending or torsion modes or combinations of them. In either of these modes there is a transversal (i.e. out-of-plane) vibration component. The parasitic effect occurs when the eigenfrequencies of parasitic modes sum nearly or exactly up to the frequency of the driven main mode: $F\_p1+F\_p2 \approx F\_main$. A subset is formed by the parasitic modes for which $2*F\_p \approx F\_main$.

The energy drainage due to autoparametric resonance occurs even for relatively small length-extensional vibration amplitudes if the operation frequency of the resonator (i.e. the actuation frequency) exactly matches the eigenfrequency of the parasitic mode. Thus, under the circumstance that there is an exact frequency match, the MEMS resonator does not meet the demand of having a non-distorted large amplitude output signal.

There are also usually a variety of parasitic modes with eigenfrequencies that lead to interaction in the vicinity of the operation frequency.

Figure 6:
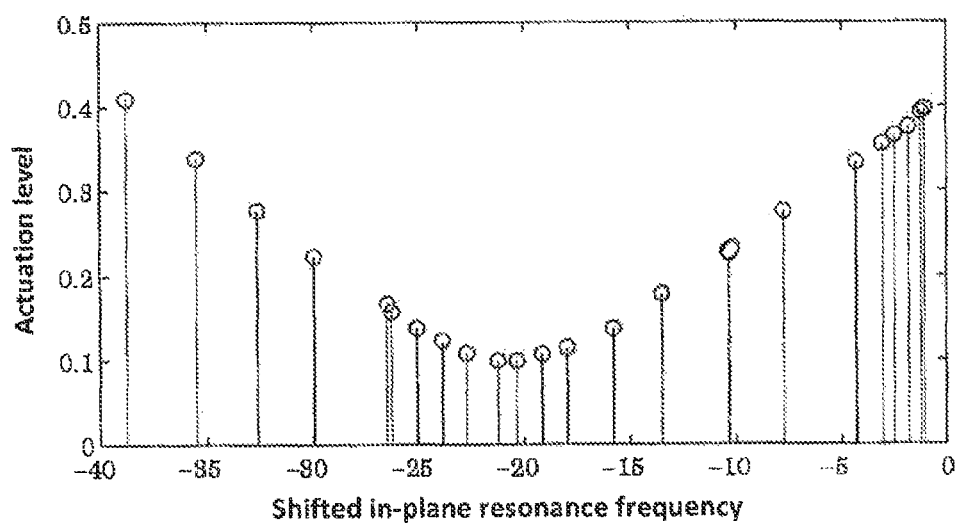
FIG. 6 shows how the maximum amplitude depends on frequency, as a result of other vibration modes at different frequencies.

When the actuation frequency is slightly shifted, the amplitude saturation occurs for a substantially larger length-extensional vibration amplitude. This is shown in FIG. 6, which illustrates the maximum vibration amplitude (i.e. the amplitude at which saturation occurs) versus actuation frequency for a particular eigenmode. The x-axis plots the frequency difference compared to the operating frequency, in units of kHz. At frequency x=−10, i.e. 10 kHz below the operating frequency of the principal mode, a superimposed series of measurements as in FIG. 6 is shown, indicating how the markers "O" in the graph are set as the maximum signal level at that frequency setting.

Thus, the frequency can be shifted to one which enables larger actuation level before the undesired capping arises.

Unfortunately, shifting the operation frequency of the resonator is not desirable since the resonance frequency of the MEMS should remain constant.

Figure 7:
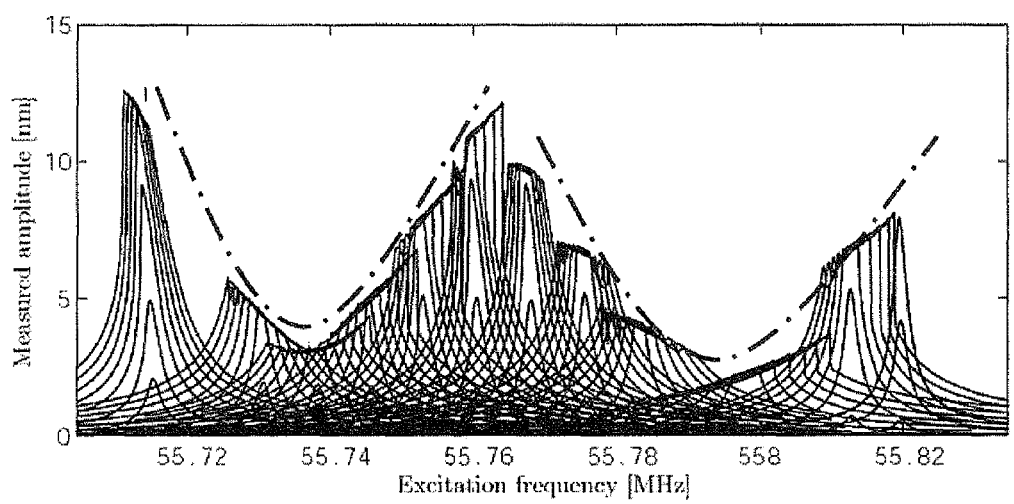
FIG. 7 shows how multiple other vibration modes at different frequencies can be present.

There are usually a variety of parasitic modes with eigenfrequencies that lead to interaction in the vicinity of the operation frequency. This is shown in FIG. 7, which shows two different eigenmodes that cause interaction in the vicinity of the operation frequency. FIG. 7 plots the maximum actuation level for different frequencies in the same way as FIG. 6. The parasitic eigenmodes cause the two troughs at around 55.74 MHz and 55.8 MHz on each side of the operation frequency around 55.76 MHz.

One approach which has been proposed by the applicant (but not yet published) to solve this problem is to shift the eigenfrequency of the parasitic mode away from the operation frequency of the MEMS resonator. This can be achieved by applying a voltage between opposite sides of the resonator body in a direction perpendicular to the resonant vibration direction, using at least one bias electrode separated from the resonator body by a non-conductive gap. This transverse voltage applied across at least one gap introduces an electric field across the resonator body, which shifts the frequency of the parasitic vibration modes. The voltage applied can be selected so that the parasitic modes are separated from the main vibration mode as part of the design of the resonator, or there can be a feedback control circuit so that the voltage is variable.

This invention is based on the recognition that instead of shifting the parasitic mode eigenfrequency, the pattern related to limited power-handling can be raised. If the threshold for the unwanted mode to arise can be shifted to a larger level, then the stable magnitude of the longitudinal mode is raised.

Figure 8:
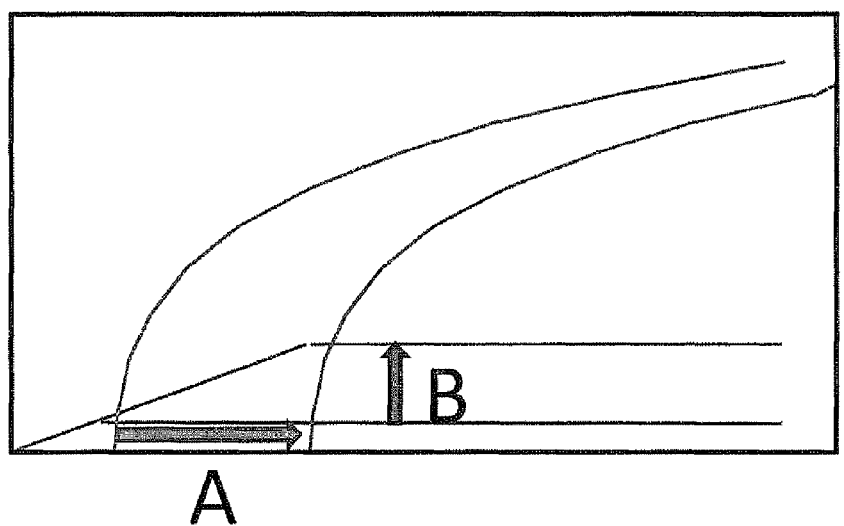
FIG. 8 shows how an applied driving force can be more effectively coupled to the main modes of vibration in accordance with the invention.

FIG. 8 shows this approach, and shows in schematic manner how the two plots of FIG. 7 can be shifted. If the onset of the unwanted mode is shifted to a higher threshold value of the applied driving force (represented by arrow A) then the saturated limited magnitude of the desired mode of vibration will be elevated (represented by arrow B).

The invention provides a resonator which uses a second resonator structure (formed from the same layer as the resonator body), for the parasitic modes of vibration. Thus, the resonator body has a desired mode of vibration of the resonator alone, and a parasitic mode of vibration, wherein the parasitic mode comprises vibration of the resonator body and the second resonator structure as a composite body. The second resonator structure can be formed from the anchor structure or as a separate component. The second resonator structure is coupled to nodal points of the main resonator body with respect to the main resonance mode.

The invention aims to raise one or more curves that describe the amplitude of vibration saturation. In the article "*Amplitude saturation of MEMS resonators explained by autoparametric resonance*" referenced above a model has been presented describing the autoparametric resonance effect.

The frequency-dependent saturation can be described by a simple expression for the vibration amplitude R1, as $$(R_1)^2 = \frac{\gamma_2^2 \Omega^2 + 4\chi_2^2}{d_2^2},$$

with $$d_2 = \frac{E}{\rho} \frac{\int \nabla \theta (\nabla \varphi)^2 dV}{\int \varphi^2 dV}.$$

Here R1 is the maximum amplitude of the desired mode of operation, $\gamma_2$ is the damping coefficient of the unwanted mode (an expression for the case of an unwanted pair of modes is available as well), $\Omega$ is the frequency of the desired mode, $\chi_2$ is a measure for frequency mismatch between desired mode and parasitic modes (worst power handling is the lowest value of R1 is when $\chi_2=0$ so at perfect frequency-match as shown in FIG. 6).

The constant d2, finally, is a geometrical parameter that determines how well the desired mode (shape function θ) can couple to the parasitic mode (shape function φ).

This invention is based on increasing the maximum amplitude of the desired mode R1. The expression shows that this can be obtained in various ways:

Increase the frequency mismatch, represented by $\chi_2$

Increase the damping of all relevant parasitic modes, represented by $\gamma_2$

Decrease the coupling between the desired mode and all relevant parasitic modes

The second and third measures provide the most easily implementable way of increasing R1. The first measure of frequency shifting can be effective if one specific parasitic mode is to be eliminated. Damping by raising gas pressure in the cavity is effective for all modes at the same time, so a good method when multiple modes are to be attached. A drawback is loss of Quality factor for the wanted main mode of vibration.

The invention is based on the recognition that the issue of limited power handling can be resolved by design, or by control of the etching process.

Figure 9:
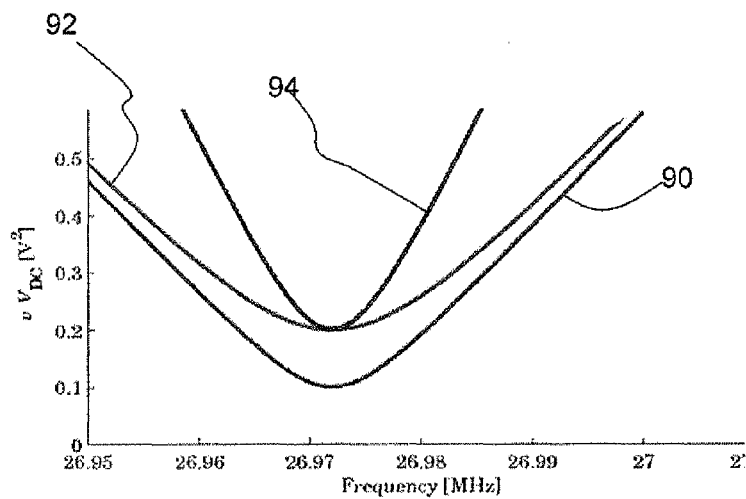
FIG. 9 shows how the maximum amplitude of the desired mode can be increased.

The effects of these two methods is shown in FIG. 9, which shows the saturation amplitude of the regular mode of the resonator, R1, as a function of frequency-detuning ($\chi_2$). The curves are governed by two properties of the unwanted mode: damping $\gamma_2$ and geometrical coupling efficiency $d_2$.

Plot 90 is an example of R1 ($\chi_2$) for a standard resonator, subject to a parasitic mode-pair with an exact frequency match at 26.973 MHz.

Plot 92 shows the obtained improvement when damping g2 is doubled. Likewise, plot 94 shows the obtained improvement when coupling d2 is halved.

Both methods (increased damping and decreased coupling) lead to improved maximum vibration amplitude R1 over the whole frequency range.

Thus, the maximum vibration amplitude increases (and the device behaves linear up to larger driving forces), regardless whether there is an exact or approximate frequency match between desired and parasitic mode.

The realisation of increased damping and reduced coupling according to this invention is now described first in general terms and then with specific examples.

In accordance with the invention, a second resonating body is provided, which is arranged to have coupling with the parasitic mode and virtually no coupling with the desired mode. In practice, this means that the resonator and the second resonating body should be connected at a point in the resonator where the desired mode exhibits essentially no vibration (a nodal point) and where the parasitic mode has non-zero vibration.

As a consequence, the desired mode will be limited in space to the resonator itself, while the parasitic mode is extended over the resonator plus the second resonating body. The geometric coupling constant ($d_2$) is roughly the division of the interacting volume over the total moving volume of the parasitic mode, so that the coupling between the two modes is smaller than before. This corresponds to movement to the plot 94 in FIG. 9.

The second body is attached to the fixed substrate (for example around its periphery) as well as having a suspended part. With the parasitic mode extending to this second resonator, this parasitic mode can induce acoustic waves into the fixed substrate. Those waves carry energy that can be assumed to be lost for the parasitic mode. Consequently, the parasitic mode has a lowered Q, i.e. larger damping coefficient $g_2$. This corresponds to movement to the plot 92 in FIG. 9.

The desired mode in the MEMS resonator of the type described with reference to FIG. 1 is the length-extensional mode. All parasitic modes have a vibration component perpendicular to the length-extensional direction.

MEMS resonators are usually fabricated such that the resonator and its suspension are portions of the same under-etched body. The body is a thin slab of silicon with trenches and holes in it.

A first example of the invention provides a design which ensures that the mode or modes that cause saturation will be modes which apply to the resonator in combination with the periphery as a whole, and that this mode has a strong damping coefficient.

Figure 10:
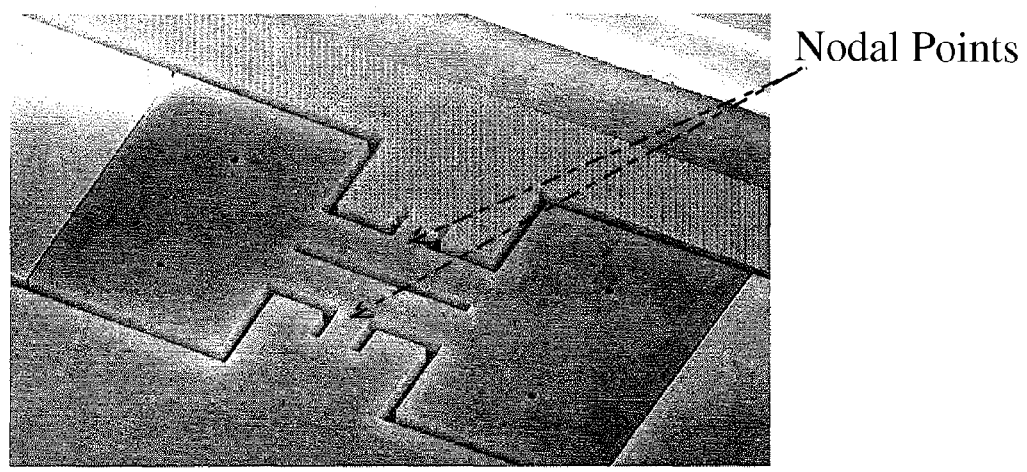
FIG. 10 shows a SEM micrograph of the known MEMS resonator of the type shown in FIG. 2.

FIG. 10 shows a SEM micrograph of the MEMS resonator of the type shown in FIG. 2, and which is for example used in timing devices. One side of the resonator suspension is shown, together with the surrounding periphery.

The top SOI layer is shown. Beneath the shown layer is the buried oxide, BOX. The BOX is etched away below all visible trench lines and holes. It does so with a certain underetch distance for example 7 microns.

Modes that consist solely of the resonator (not the suspension) performing a certain bending or torsional vibration tend to have low damping. This is actually good for the regular operation of the resonator. On the other hand, modes where the periphery joins in the vibration as well tend to have large damping, since the vibration loses energy easily to the outside world easily.

The resonator has to be suspended in order to be able to vibrate. Unwanted vibrational modes other than the one intended for signal generation hamper large-amplitude operation. These unwanted modes can be damped by making a composite structure, which is the same as adding secondary resonating bodies. The secondary bodies can freely be designed and have to have resonance frequencies that match those of the unwanted modes of the resonator.

Conveniently, secondary bodies may be realised during the same underetch process that is required for the resonator to be released. Intentional shaping of the secondary bodies is possible by design. They may also be formed as separate elements or as part of the existing anchor structure.

One example of resonator structure is fabricated in a silicon on insulator (SOI) substrate.

The process flow to achieve a high-quality resonator with MHz frequency range is well known.

Figure 11A:
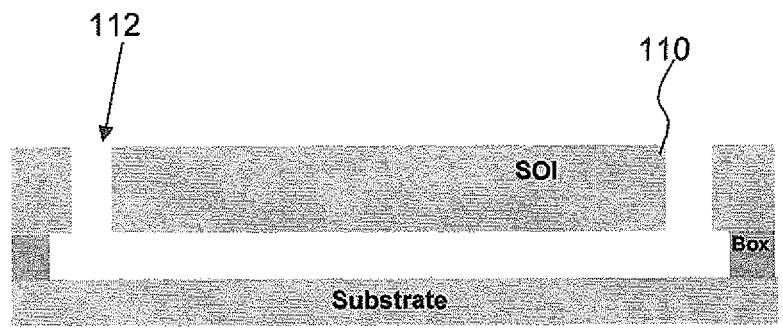
FIGS. 11A and 11B show a cross-section and top-view of a known structure.
Figure 11B:
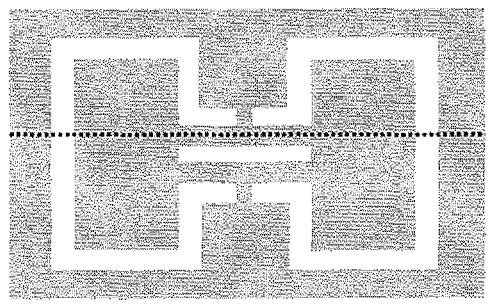

The cross-section and top-view in FIGS. 11A and 11B show the known structure. The top view corresponds to the design of FIG. 10. The cross section shows the resonator body 110 formed from the top silicon layer of the SOI substrate. The sacrificial etch removes the insulator (buried oxide) layer beneath the resonator body, using release etch openings 112 in the top silicon layer.

The geometry of the resonator is thus defined by a surrounding trench pattern in the top silicon layer, and a vapour HF release etch through this trench pattern forms the resonator and releases it by etching away the buried oxide.

The release etch is a timed process. The etch must not be too long, so that there is release only of the resonator, i.e. the parts that are intended to vibrate.

Figure 12:
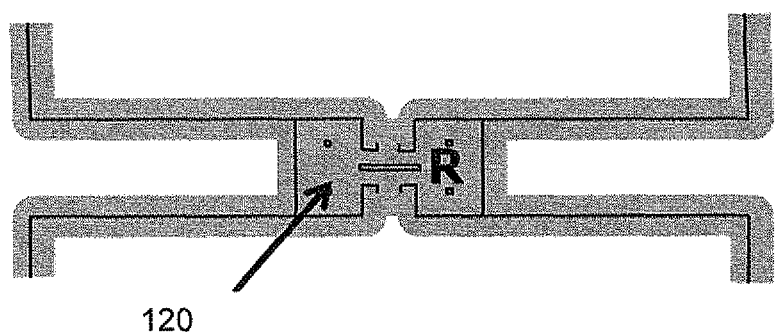
FIG. 12 shows a shaded area around all the defined trenches and holes in the known etch release pattern, where the buried oxide is to be removed.
Figure 13:
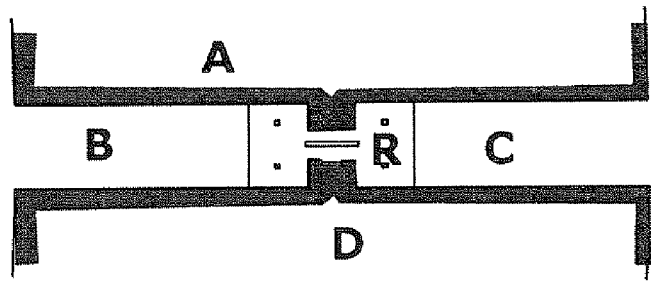
FIG. 13 shows that areas from which the resonator is suspended are also underetched and these can be used as resonator structure in accordance with the invention.

FIG. 12 shows a shaded area around all the defined trenches and holes in the known etch release pattern, where the buried oxide is to be removed. The resonator 120 ("R") is defined by trenches and holes (the solid lines) through which the buried oxide layer beneath is etched away. The etch has a certain underetch, giving rise to the shaded area, FIG. 13 shows that areas A and D from which resonator R is suspended, are also underetched. These areas serve as bias electrodes to run a current through the resonator. They were not intended to vibrate.

Areas B and C are also have suspended portions, but not physically connected to the resonator body.

Figure 14:
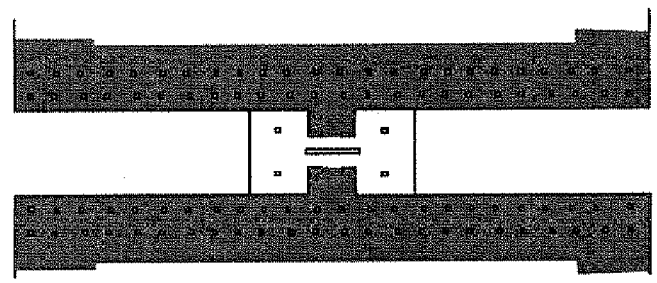
FIG. 14 shows the addition of etch holes to increase the underetched area in areas other than the area beneath the resonator itself.

FIG. 14 shows the addition of etch holes to the areas A and D. The placement of additional holes in the electrode areas A and D increases the underetched area in areas other than the area beneath the resonator itself. Holes in areas other than the resonator effectively generate secondary suspended bodies. These bodies will have multiple vibrational modes of themselves. Since these secondary bodies are physically connected to the resonator, there will exist vibrational modes of the composite structure.

It can be seen from FIG. 14 that the additional etch holes effectively mean that regions of the anchor electrodes are suspended so that the anchor elements become the secondary resonating structure.

The use of etch holes enables the level of underetching to be controlled in different regions. Design of the holes/trenches for etching is easily implemented. Thus, in the design of FIG. 14 a much larger underetch (than the 7 microns mentioned in connection with FIG. 10) is achieved not by underetching longer/further, but by using additional holes in the SOI layer. Around each hole, as before, all of the BOX layer is etched away with a radius of 7 microns.

Figure 15:
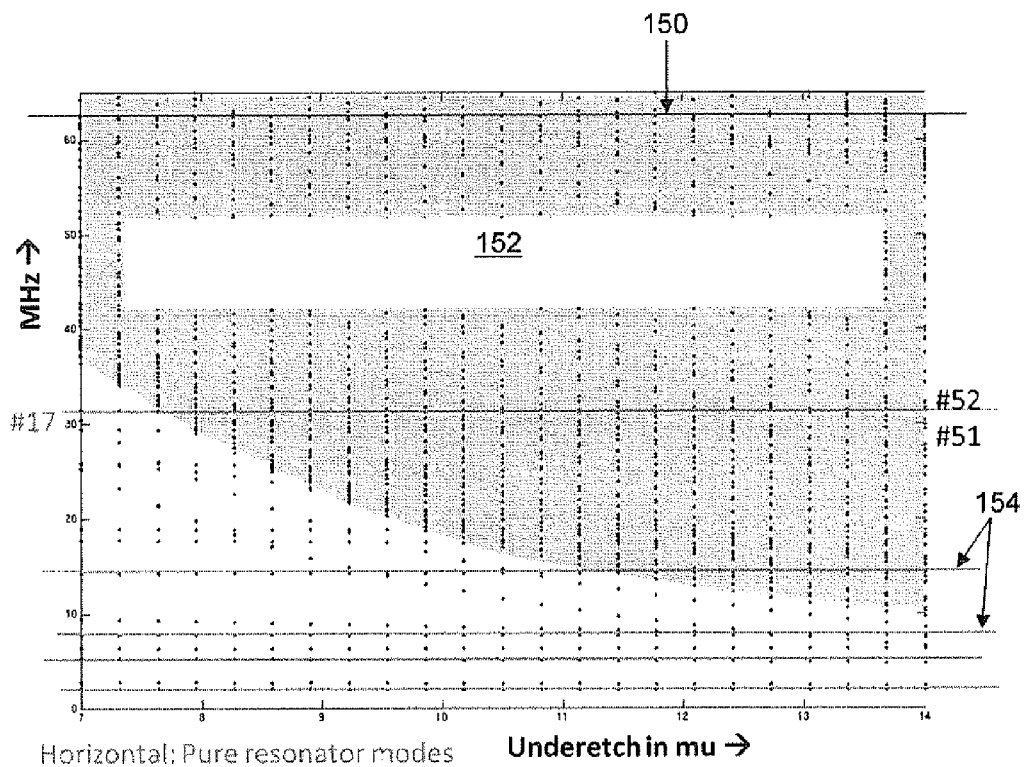
FIG. 15 shows the modal density of the composite structure (resonator plus suspending areas)

FIG. 15 shows the modal density of the composite structure (resonator plus suspending areas). The amount of underetch controls the placement in frequency of resonator modes.

Taking a 7 micron underetch, the resonator mode number 17 (counting from low-frequency to high frequency) is at 31.34 MHz. This mode is contained with the resonator body, and the vibrations do not extend into the support electrodes.

Taking a 14 micron underetch, the same resonator motion is seen as a composite mode shape, which extends into the support electrodes. The mode of the same frequency now has index number 51, indicating that many more modes are present.

The line 150 shows the main longitudinal resonator mode. The shaded area 152 of the graph of FIG. 15 shows that making the peripheral area larger causes more modes to be present at lower frequencies. The horizontal lines 154 show other pure resonator modes.

FIGS. 16A and 16B show graphically the two different modes outlined above. FIG. 16A shows the 7 micron underetch mode at 31.34 MHz and FIG. 16B shows the 14 micron underetch mode at the same frequency. The vibrations shown in FIG. 16B illustrate the coupling of vibration modes across the anchor.

The invention provides a design in which low frequency resonator modes are provided which are damped composite modes (i.e. the vibration of the resonator and the supports).

As will be clear from the description above, the invention makes use of shaping of the area outside of the resonator, for example by designed underetching areas other than the resonator. Etch-holes can be used for this purpose to determine where regions are to be suspended from the supporting buried oxide layer. Beyond the suspended part, the area outside the anchor structure is attached to the fixed surroundings.

In the example above, the anchor areas are used to form the secondary resonating structure. Instead, a separate component can be used. It is again coupled to the main resonator at the nodal point, i.e. coupled to the same area as the anchors. In one example, this secondary resonator structure can comprise an annular shape, which connects at one point around the periphery to the main resonator body at the nodal point. Thus, even when the secondary resonator body is designed separately to the anchors, it can still be considered to form part of the anchor arrangement, since it is mechanically connected between the resonator body and the fixed structure.

FIG. 17 shows a square annulus which can surround a fixed pad, such as an electrode contact pad at which the anchor signal is provided or read out. The annulus has a radial width 170 and an inner opening size 172.

The annulus is a square ring of SOI material, for example with a thickness 170 of 1.5 µm to match resonator material. The inner dimension 172 can be 90 µm (which is an example size of a bondpad) and a certain underetch distance as the width of the 'ring' around that square.

In this example, the inside of the square is clamped to the fixed contact pad. The invention can be implemented as a certain width dimension of a suspended region around the contact pad that ensures sufficient modes to be present in the secondary structure.

FIG. 18 shows the number of vibration modes below the resonant frequency as a function of the ring width (which is equivalent to the underetch width).

The larger the underetch, the more modes in the structure. Clearly, a minimum value arises, just below 6 μm.

Thus, for the example of a 90 μm square, thus with a perimeter of 360 μm, the minimum width of the structure should be 6 μm, preferably larger than double this (i.e. larger than 12 μm).

For an annular ring, in general, the width controls the occurrence of modes below the desired frequency. Modes below the main frequency of the resonator are those for which the parasitic losses arise. The length then controls how many modes are to be found at a given width.

Figure 19A:
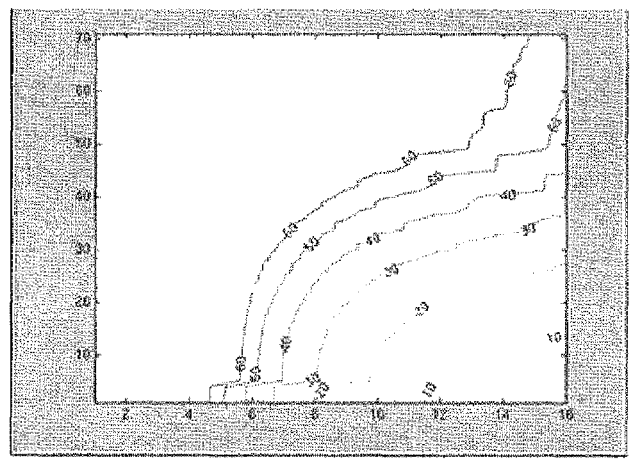
FIGS. 19A, 19B and 19C show the mode density for different sizes of shape of FIG. 17.
Figure 19B:
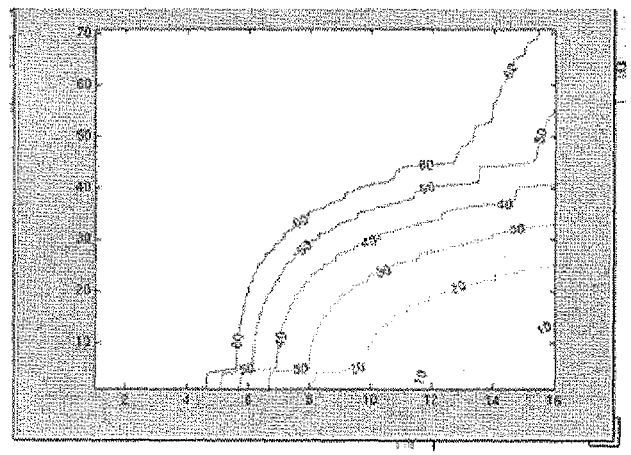
Figure 19C:
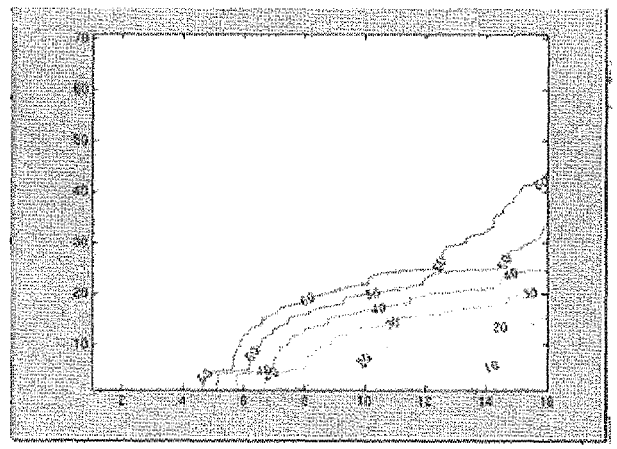

This is illustrated in FIGS. 19A, 19B and 19C, which show three sets of graphs similar to FIG. 18. FIG. 19A is based on a perimeter of 400 μm, FIG. 19B is based on a perimeter of 360 μm and FIG. 19C is based on a perimeter of 160 μm. In the graphs lines corresponding to resonator designs with main resonant frequency of 10 MHz, 20 MHz, 30 MHz, 40 MHz, 50 MHz and 60-MHz are shown.

For all resonant frequencies and sizes, the number of modes increases with the size of the underetch, and there is a lower underetch limit below which no modes are present. For example, for underetch smaller than 6 μm, no modes in the body are below 60 MHz. In all three figures, the pattern is the same and scales only vertically, i.e. in the number of modes.

Similar considerations apply for resonator structures which are not annular structures, for example the resonator strips formed by the underetching in FIG. 14. Generally, the invention can be implemented by using the anchor arrangement or a separate structure to form a secondary resonator body. The width of the suspended part of the secondary resonator can be in the range 6 to 20 μm. The width can either be set by the degree of underetching (i.e. timing control) or by using addition etch holes, so that the degree of underetching remains the same (such as 7 μm), but the hole pattern essentially forms a joined underetch region.

The second resonator structure generally can comprise one or more elements (connected or separate) which include suspended parts by means of the underetching, in order to create the desired vibration modes.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. A resonator comprising:
a first resonator body;
an actuation arrangement for driving the resonator into a main resonant mode, in which the first resonator body vibrates parallel to a first axis wherein the main resonant mode includes a set of nodal points along the first axis of the first resonator body;
a detection arrangement for detecting the vibration in the first axis direction and generating an electrical output signal derived from the vibration; and
a second resonator structure which is coupled to at least one of the nodal points on the first resonator body;
wherein the first resonator body includes,
the main resonant mode, wherein the first resonator body vibrates and wherein the second resonator structure located at the nodal point of the resonator minimally vibrates, and
a parasitic mode of vibration, wherein the first resonator body and the second resonator structure vibrate together as a composite body;
an anchor arrangement which provides a connection between the first resonator body and a fixed support;
wherein the second resonator structure comprises the anchor arrangement; and
wherein the anchor arrangement comprises electrode areas having etch holes, and a cavity area formed beneath the etch holes.

2. A resonator as claimed in claim 1, wherein the anchor arrangement comprises a pair of anchor elements mechanically coupled to the first resonator body, and a sensing circuit which drives a current through the first resonator body between the anchor elements, wherein the anchor elements and the first resonator body together form a composite resonant structure with composite eigenmodes with mode shapes having vibration components in directions perpendicular to the first axis in the first resonator body and the anchor elements.

3. A resonator as claimed in claim 1, wherein the second resonator structure comprises a suspended body which is connected to the fixed support.

4. A resonator as claimed in claim 3, wherein the anchor arrangement comprises a pair of anchor elements mechanically coupled to the first resonator body, and a sensing circuit which drives a current through the first resonator body between the anchor elements, wherein the second resonator structure and the first resonator body together form a composite resonant structure with composite eigenmodes with mode shapes having vibration components in directions perpendicular to the first axis in the first resonator body and the second resonator structure.

5. A resonator as claimed in claim 2, where the quality factor of the composite eigenmodes of the resonator is lower than the quality factor of the desired resonator eigenmode.

6. A resonator as claimed in claim 1, wherein the second resonator structure comprises a plurality of bodies which are mutually not coupled mechanically.

7. A resonator as claimed in claim 1, wherein the second resonator structure comprises a plurality of bodies which are mutually coupled mechanically.

8. A resonator as claimed in claim 1, wherein the second resonator structure comprises a suspended closed shape around a fixed centre and formed from the same layer as the first resonator body.

9. A resonator as claimed in claim 8, wherein the closed shape has a width in the range 6 to 20 μm.

10. A resonator as claimed in claim 1, wherein the first resonator body comprises a pair of arms which extend along the first axis direction, with a head at each end of the pair of arms, and an anchor arrangement which comprises two anchor elements, which connect laterally to the midpoint of the two arms.

11. A resonator as claimed in claim 10, wherein the actuation arrangement comprises electrodes at the ends of the heads positioned along a central axis in the first axis direction of the resonator.

12. A resonator as claimed in claim 1, comprising a MEMS resonator.

13. A resonator comprising:
means for driving a first resonator body into a main resonant mode, in which the first the resonator body vibrates parallel to a first axis wherein the main resonant mode includes a set of nodal points along the first axis of the first resonator body;
means for detecting the vibration in the first axis direction and generating an electrical output signal derived from the vibration; and
a second resonator structure means which is coupled to at least one of the nodal points on the first resonator body;
wherein the first resonator body includes,
    the main resonant mode, wherein the first resonator body vibrates and wherein the second resonator structure located at the nodal point of the resonator minimally vibrates, and
    a parasitic mode of vibration, wherein the first resonator body and the second resonator structure vibrate together as a composite body;
an anchor arrangement which provides a connection between the first resonator body and a fixed support;
wherein the second resonator structure comprises the anchor arrangement; and
wherein the anchor arrangement comprises electrode areas having etch holes, and a cavity area formed beneath the etch holes.

14. A resonator as claimed in claim 1, wherein the main resonant mode is an in-plane longitudinal mode and the parasitic mode is an out-of-plane bending or torsional mode.

15. A resonator comprising:
a first resonator body;
an actuation arrangement for driving the resonator into a main resonant mode, in which the first resonator body vibrates parallel to a first axis wherein the main resonant mode includes a set of nodal points along the first axis of the first resonator body;
a detection arrangement for detecting the vibration in the first axis direction and generating an electrical output signal derived from the vibration;
a second resonator structure which is coupled to at least one of the nodal points on the first resonator body;
wherein the first resonator body includes,
    the main resonant mode, wherein the first resonator body vibrates and wherein the second resonator structure located at the nodal point of the resonator minimally vibrates, and
    a parasitic mode of vibration, wherein the first resonator body and the second resonator structure vibrate together as a composite body; and
wherein the second resonator structure comprises a plurality of bodies which are mutually not coupled mechanically.

* * * * *